United States Patent [19]

Matsui et al.

[11] 4,293,891

[45] Oct. 6, 1981

[54] NATURAL AIR COOLED RACK FOR VERTICALLY DISPOSED PRINTED BOARDS

[75] Inventors: Kiyoshi Matsui; Katsuyuki Arai; Sueo Shinbashi, all of Kawasaki, Japan

[73] Assignee: Fujitsu Limited, Kawasaki, Japan

[21] Appl. No.: 152,559

[22] Filed: May 23, 1980

[30] Foreign Application Priority Data

May 28, 1979 [JP] Japan ................................. 54-64959

[51] Int. Cl.³ .............................................. H05K 7/20
[52] U.S. Cl. ............................ 361/383; 165/DIG. 5; 165/128; 174/16 R
[58] Field of Search .......................... 174/15 R, 16 R; 165/DIG. 5, 128; 361/382–384; 98/58, 60

[56] References Cited

U.S. PATENT DOCUMENTS 3,730,264  5/1973  Krylow ............................... 361/383
4,149,218  4/1979  Carrubba ............................. 361/383

OTHER PUBLICATIONS

Ventilation System for Data Processing Systems, IBM Tech. Discl. Bull., Hammer and Syler, vol. 17, No. 9, Feb. 1975, pp. 25-29.

*Primary Examiner*—Gerald P. Tolin
*Attorney, Agent, or Firm*—Staas & Halsey

[57] ABSTRACT

A natural air cooled rack for vertically disposed printed boards. The rack comprises a plurality of stacked cases for housing printed boards. Each of the cases has draft openings on the upper surface and the lower surface thereof. An interspace is formed between one or more upper cases and the one or more lower cases. At least one supply opening and at least one exhaust opening are formed in the front portion of said interspace. The supply opening communicates with said draft opening on the lower surface of said upper case while said exhaust opening communicates with said draft opening on the upper surface of said lower case. Said exhaust opening is located substantially above said supply opening.

5 Claims, 10 Drawing Figures

NATURAL AIR COOLED RACK FOR VERTICALLY DISPOSED PRINTED BOARDS

BACKGROUND OF THE INVENTION

1. Field of the Invention

The present invention relates to a rack for housing a number of printed boards, more particularly it relates to an improvement of a natural air cooled rack for vertically disposed printed boards.

2. Description of the Prior Art

In a communication system, a number of printed circuit boards on which electric or electronic elements are mounted are housed within a rack. A natural air cooled rack is known in which many interspaced printed boards are disposed vertically so that air naturally passes between the printed boards in order to cool them. Such a rack comprises a plurality of stacked cases for housing printed boards. In order to effectively occupy the floor space, it is usual to arrange two racks so that the back of one rack faces the back of the other rack. Such an arrangement is called a back-to-back arrangement.

SUMMARY OF THE INVENTION

An object of the present invention is to provide improved cooling by natural draft of vertically oriented printed circuit boards in cases stacked vertically in a rack by providing interspaces between pairs of said cases and means for supplying and exhausting air at the front of each stack. Two stacks may be arranged back-to-back with adequate cooling.

DETAILED DESCRIPTION OF THE PREFERRED EMBODIMENTS

The present invention will now be described in detail in contrast with the prior art.

Figure 1:
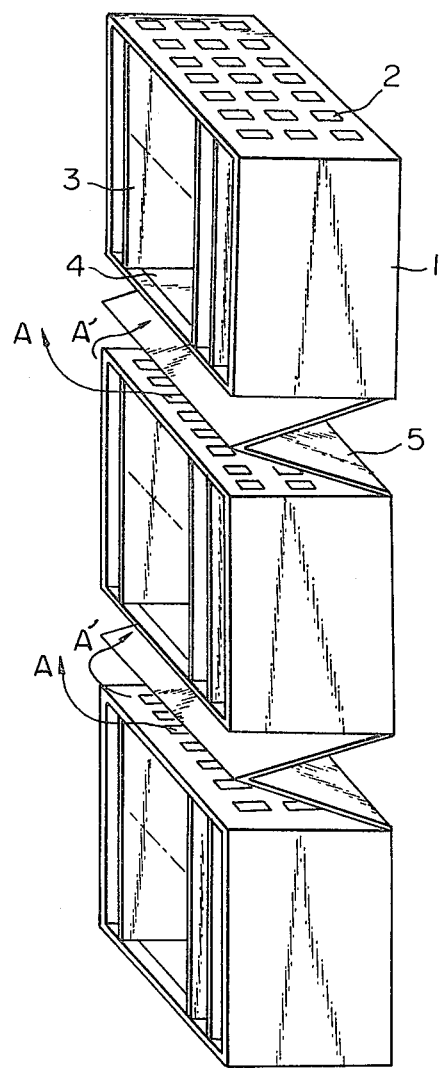
FIG. 1 is a perspective view of a natural air cooled rack for vertically disposed printed boards according to the prior art.

An example of a natural air cooled rack for vertically disposed printed boards according to the prior art is illustrated in FIG. 1. For example, three printed board cases 1 are stacked vertically as illustrated in the drawing. Each of these cases 1 houses a number of vertically disposed printed boards 3. Draft ports 2 are formed on the upper wall of the case 1 so as to exhaust heated air. A draft opening 4 is formed on the bottom of the case 1 so as to intake cooling air. A baffle plate 5, which is folded to form a V shape, is provided between the printed boards cases 1, 1 so as to prevent heated air from the draft ports 2 from flowing into the upper case 1 through the draft opening 4 thereof. However, in such a natural air cooled rack for vertically disposed printed boards, a part of the heated air exhausted through the draft ports 2 of the lower printed boards case 1, as represented by an arrow A, flows into the upper printed boards case 1 through the draft opening 4 thereof, as represented by an arrow A'. Therefore, the draft air temperature of the upper case becomes high and the cooling effect of the printed boards case is greatly degraded in the upper case.

In another earlier rack, a flat baffle plate, instead of a V-shaped baffle plate, obliquely partitions the space between the cases, i.e. the flat baffle plate is arranged between the front edge of the upper case and the rear edge of the lower case. In such a rack, air in the back side of the rack is supplied into the case through the lower draft opening and heated air is exhausted to the front side of the rack through the upper draft ports. In a back-to-back arrangement of such racks, since the space between the two back surfaces is narrow and since cables are disposed in this narrow space, cooling air is not sufficiently supplied into the case and thus the desired cooling effect is not obtained.

The present invention was made considering the above points. It is an object of the present invention to avoid degrading of the cooling effect in the upper cases of the racks in a back-to-back arangement so as to maintain a stable function of the communication system. A natural air cooled rack for vertically disposed printed boards according to the present invention comprises a frontward supply opening and a frontward exhaust opening in the interspace between the upper case and the lower case. This supply opening communicates with the lower draft opening of the upper case. The exhaust opening communicates with the upper draft ports of the lower case. The exhaust opening is substantially arranged above the supply opening.

Figure 2:
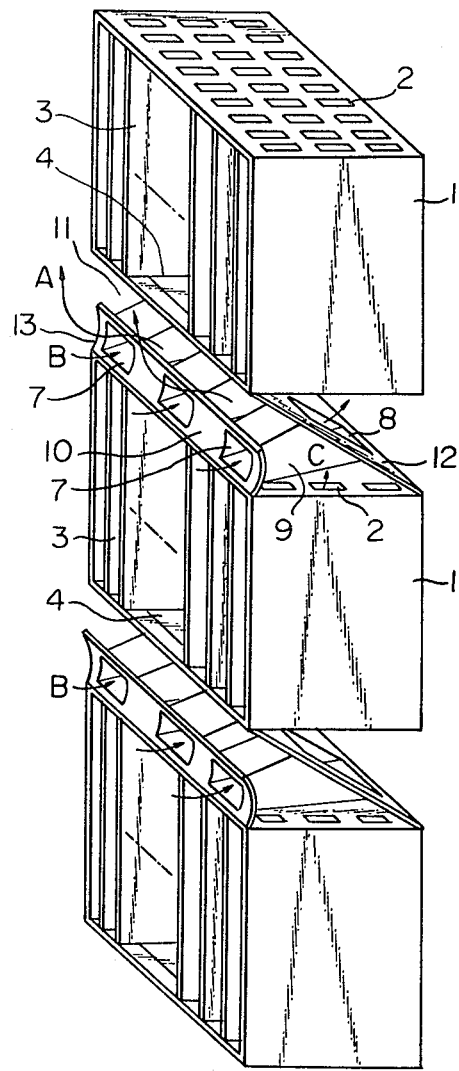
FIG. 2 is a perspective view of a natural air cooled rack for vertically disposed printed boards according to the present invention.
Figure 3:
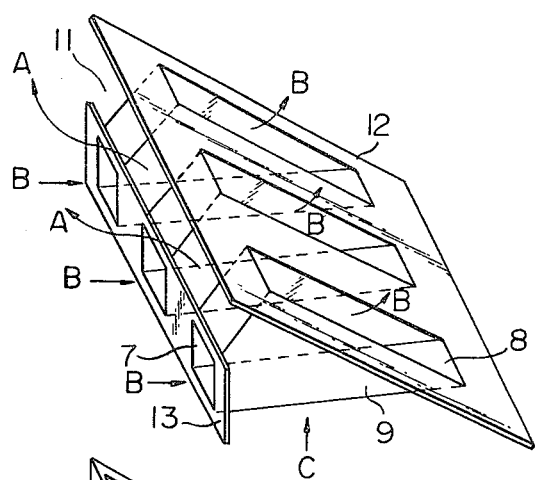
FIG. 3 through FIG. 7 are perspective views of ventilation equipment of different examples of the rack according to the present invention, respectively.
Figure 4:
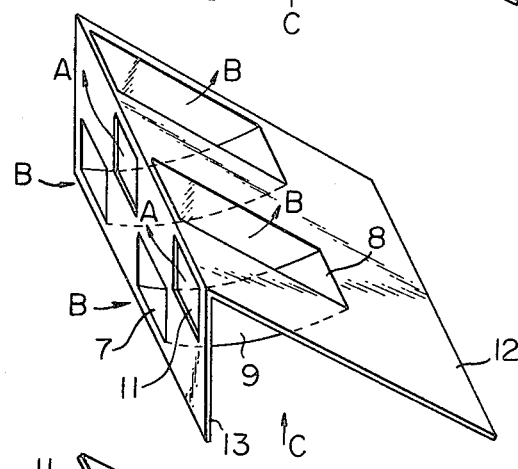
Figure 5:
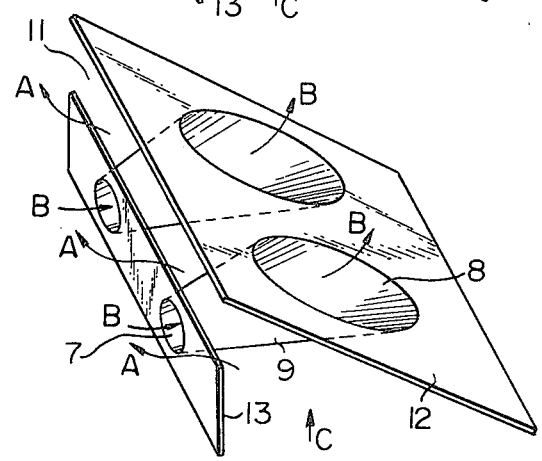
Figure 6:
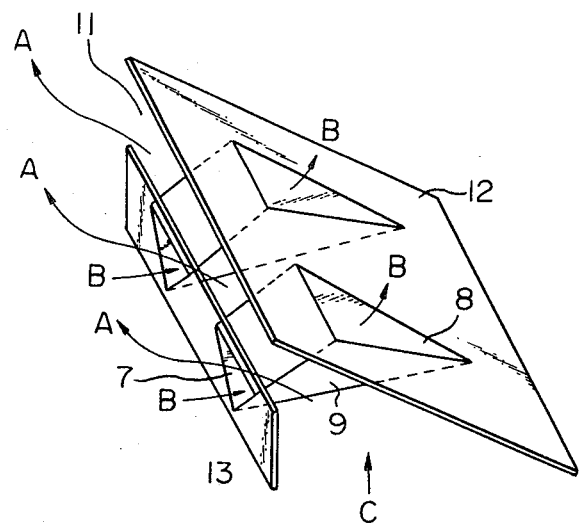
Figure 7:
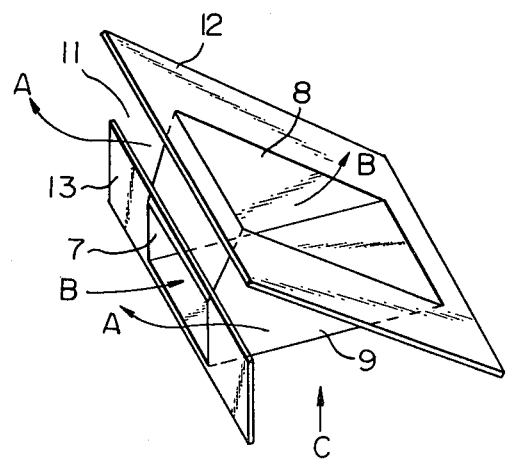

An embodiment of the rack according to the present invention is illustrated in FIG. 2. A number of printed boards 3 are vertically interspaced and housed within a box shaped case 1. Draft ports 2 are formed on the upper surface of the case 1 so as to exhaust heated air out of the case 1. A draft opening 4 is formed on the lower surface of the case 1 so as to introduce cooling air into the case 1. A baffle plate 12 is obliquely arranged between the cases 1 and 1. A baffle wall 13 is provided in the front under portion of the space between the cases 1 and 1. The baffle wall 13 has supply openings 7 each of which communicates with a supply outlet 8 formed on the baffle plate 12 through a supply passage 9. The front upper portion of the space between the case 1, 1 is opened so as to serve as an exhaust opening 11 which communicates with the upper draft ports 2 of the lower case 1. A plurality of cases 1 are supported and housed within a rack frame (not shown). If many cases are installed within the rack frame, the interspace between the cases for supplying and exhausting draft air may be formed in every two or three cases instead of every case.

In the rack of the above mentioned construction, air is heated by electronic elements (not shown) mounted on the printed boards 3 in the case 1. The heated air flows through the draft ports 2 as shown by an arrow C and then is exhausted through the exhaust opening 11 and rises in front of the upper case 1 as shown by an arrow A. Cool air is introduced through the supply openings 7 as shown by an arrow B. The cool air passes through the supply passage 9 and the supply outlet 8 and then flows into the upper printed boards case 1 through the lower draft opening 4 threreof so as to cool off the printed boards 3. Each of the printed boards 3 is cooled by the above mentioned natural convectional air circulation. Since the supply openings 7 are located below the exhaust opening 11, the heated air exhausted through the exhaust opening 11 never flows into the supply openings 7. Sufficiently cool air is introduced through the supply openings 7. Therefore, the cooling effect of the upper cases can be kept within a tolerance limit.

Other examples of natural ventilation equipment of the rack according to the present invention are illustrated in FIGS. 3 through 7. In each of the examples, the exhaust opening 11 is located above the supply opening 7 and the heated air from the exhaust opening 11, as shown by the arrow C, flows upward, as shown by the arrow A, so that the heated air is never introduced into the supply opening 7.

Figure 8:
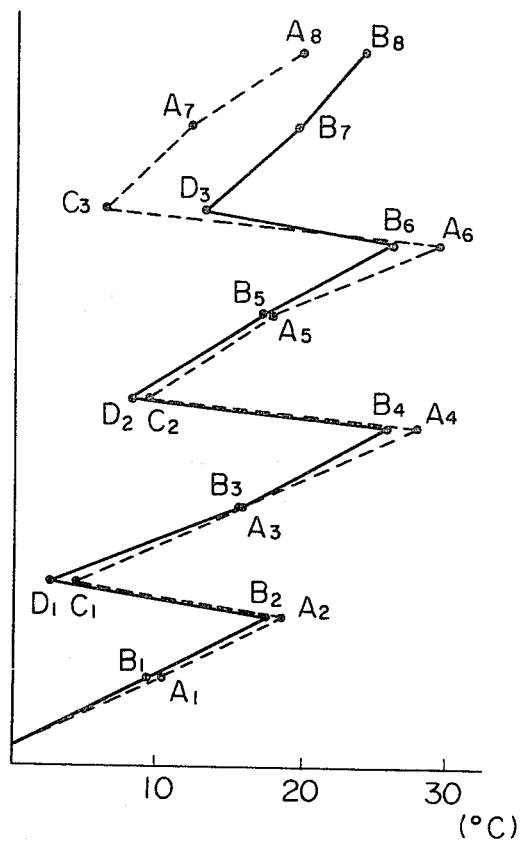
FIG. 8 is a graphical view which represents temperature rise in the rack of the prior art and the rack of the present invention.
Figure 9A:
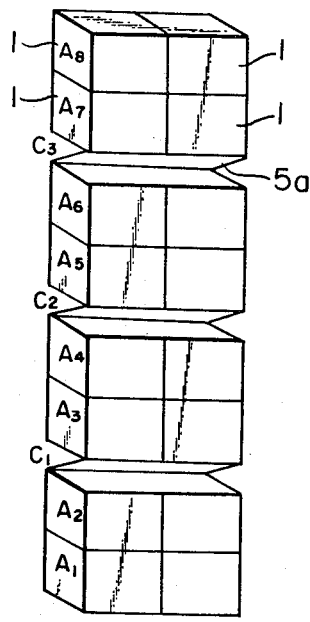
FIGS. 9A and 9B are perspective views of racks of the prior art and the present invention, which racks were used in the experiment. The rack of prior art in FIGS. 9A and 9B is different from that of FIG. 1.
Figure 9B:
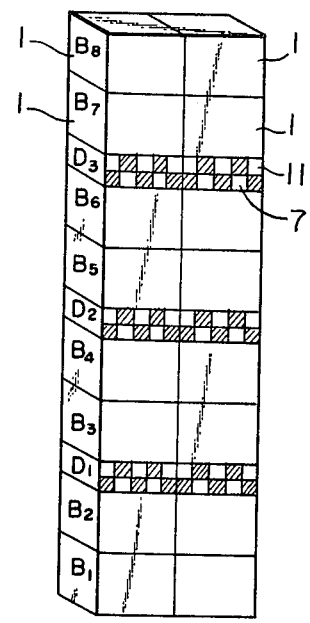

In FIG. 8, an experimental result of the air temperature increase in the rack is graphically illustrated. The solid line represents the case of the rack according to the present invention and the dotted line represents the case of the rack according to the prior art. The rack of the prior art used in the experiment is illustrated in FIG. 9 (A). In this rack, a baffle plate $5a$ is obliquely installed in the interspace between every two printed boards cases 1. This rack has a height of 2375 mm, a width of 520 mm and a depth of 225 mm. The interspace between every two cases is 125 mm. Two racks of this kind are arranged in a back-to-back arrangement. Electrical power is supplied to each of the racks, so as to energize the electric or electronic parts on the printed circuit boards which are evenly disposed in each case. In this state, the air temperature is measured at the upper center portion of each of the cases ($A_1$ through $A_8$). Also, the supply air temperature is measured at the back portion ($C_1$, $C_2$, $C_3$) of each baffle plate $5a$.

The rack of the present invention used in the experiment is illustrated in FIG. 9 (B). Experimental conditions are the same as in the rack of the prior art. Air temperature in each of the printed boards cases ($B_1$ through $B_8$) and supply air temperature through the supply opening 7 are measured. The abscissa of the graph of FIG. 8 represents the difference between the measured temperature and the room temperature. The ordinate represents the measuring position. As can be seen from the graph, at the points $A_6$ and $B_6$ each of which represents the maximum temperature of each rack, the rack of the present invention has a temperature of about 3° C. lower than does the—prior art rack. Therefore, in the rack of the present invention, the maximum air temperature can be lowered so as to prevent the temperature of the rack from exceeding the thermal tolerance limit.

In the illustrated embodiments of the present invention in the drawings, the front of each printed boards case and the side ends of each ventilation equipment are not covered for the clarification of the drawings. However, in actual use, they are covered by an appropriate front panel and side panels. The front of the ventilation equipment arranged between upper and lower cases is covered by a grille or the like which does not prevent air ventilation.

In the above mentioned embodiments heretofore, all the printed circuit boards cases house a number of printed boards. However, electric devices such as power source, control unit and display unit may be housed within some of the cases instead of a part of or all of the printed boards. The present invention includes a rack which comprises cases within which electric devices other than printed circuit boards are housed.

We claim:

1. A natural air cooled rack for supplying cooling air to vertically disposed printed circuit boards comprising
at least one vertical stack of cases, each case holding a plurality of said printed circuit boards in a vertical position, and, each case having draft openings on the upper surface and the lower surface thereof, said cases being arranged on said stack so that an interspace is formed between at least one uper case and a respective lower case;
a front member formed in the front portion of each said stack at each interspace to have at least one supply opening and at least one exhaust opening in the front portion of each said stack, said supply opening communicating with said draft opening on the lower surface of the respective upper case and said exhaust opening communicating with said draft opening on the upper surface of the respective lower case and said exhaust opening being located substantially above said supply opening in each said front member.

2. The rack of claim 1, each said interspace being formed between every two adjacent cases of each said vertical stack.

3. The rack of claim 1, comprising at least two of said adjacent cases being stacked without forming an interspace therebetween.

4. The rack of claim 1, comprising a baffle plate obliquely installed in each said interspace to extend between the front edge of the respective upper case and the rear edge of the respective lower case, and at least one supply passage for communicating through at least one opening formed in each said baffle plate with said supply opening of the respective upper case.

5. The rack of claim 1, 2, 3 or 4, comprising two of said stacks arranged back-to-back in said rack.

* * * * *

UNITED STATES PATENT AND TRADEMARK OFFICE
CERTIFICATE OF CORRECTION

PATENT NO. : 4,293,891
DATED : 6 October 1981
INVENTOR(S) : KIYOSHI MATSUI et al It is certified that error appears in the above—identified patent and that said Letters Patent is hereby corrected as shown below:

Col. 3, line 2, "threreof" should be --thereof--;
line 27, "9(A)" should be --9A--;
line 42, "9(B)" should be --9B--;
line 54, "C." should be --C--;
"the--prior" should be --the prior--.
Col. 4, line 13, delete "circuit";
line 14, after "printed" insert --circuit--;
line 28, "uper" should be --upper--.

Signed and Sealed this

Twenty-third Day of February 1982

[SEAL]

Attest:

GERALD J. MOSSINGHOFF

Attesting Officer

Commissioner of Patents and Trademarks